United States Patent [19]
Muller-Girard et al.

[11] Patent Number: 4,591,796
[45] Date of Patent: May 27, 1986

[54] PERFORMANCE PREDICTABLE LINEARIZING OR FUNCTION MODIFYING CIRCUIT

[75] Inventors: Otto Muller-Girard, Rochester; Alan Miller, Pittsford, both of N.Y.

[73] Assignee: Transmation, Inc., Rochester, N.Y.

[21] Appl. No.: 593,430

[22] Filed: Mar. 26, 1984

[51] Int. Cl.[4] .......................... H03K 4/10; H03K 5/12
[52] U.S. Cl. ..................... 328/184; 307/228; 307/263; 328/185
[58] Field of Search ....................... 328/184, 185, 119; 307/263, 228

[56] References Cited

U.S. PATENT DOCUMENTS

| | | | |
|---|---|---|---|
| 2,975,369 | 3/1961 | Vance | 328/185 |
| 3,482,169 | 12/1969 | Peterson | 307/263 |
| 4,342,965 | 8/1982 | Baldwin | 328/114 |
| 4,438,466 | 3/1984 | Fawkes et al. | 328/185 |

Primary Examiner—Stanley D. Miller
Assistant Examiner—B. P. Davis
Attorney, Agent, or Firm—Jay M. Cantor

[57] ABSTRACT

The disclosure relates to a linearizer circuit capable of substantially replicating a non-linear waveform on a piece-wise linear basis by providing a pair of circuits, one capable of reducing the slope of an output circuit curve when a predetermined output level has been reached and the other capable of increasing the slope of an output circuit curve when a different predetermined output level has been reached. Such circuits are cascaded in required order and with predetermined slope parameters to replicate a non-linear curve on a piece-wise linear basis.

16 Claims, 6 Drawing Figures

PERFORMANCE PREDICTABLE LINEARIZING OR FUNCTION MODIFYING CIRCUIT

BACKGROUND OF THE INVENTION

1. Field of the Invention

This invention relates to an electrical circuit for modifying or linearizing the output of an electrical signal producing device.

2. Description of the Prior Art

The need for circuits which can alter a signal in a predictable way to remove an unwanted non-linearity has been a persistent one to instrument designers. The electrical signals derived from common transducers of physical variables are often non-linear in that, for even increments of physical change, they produce varying increments of electrical signal depending on the magnitude of the variable. Thus, for example, thermocouples employing the Seebeck effect are used to transduce temperature into voltage. The input/output relationship for such thermocouples is quite non-linear in that, for example, at 100° C. a thermocouple designated as type "R" produces an output change of 7.5 micro-volt per degree Centigrade change in temperature, whereas at 1000° C., the output change is 13.75 micro-volt per degree Centigrade. There are many other thermocouple types designated for example as J, K, T, E, B, etc., each of which has its own temperature-to-voltage relationship and each one of which is non-linear to some measure. Still other transducers produce non-linear responses. Further examples are: flow transducers based on the differential pressure or flow head difference principle which are characterized by an output which is proportional to some power of the flow and radiation sensors, the output of which is approximately related to the fourth power of the absolute temperature being sensed. Still other examples could be cited.

The electrical signals from transducers, such as those mentioned, are used for indication, recording, and/or controlling of the physical variable of interest. The fact that the signals are a non-linear representation of the physical variable is a problem of perception to the human observer whose expectation is that the indication or recording directly corresponds to the physical variable, rather than a non-linear electrical representation, and is stated in the applicable engineering units, such as degree Fahrenheit, gal/min, degree Kelvin, etc.

The problem of producing the acceptable presentation of a signal which is non-linearly related to its source physical variable has been solved in the past in various ways. To name but a few consider: use of non-uniform scales or charts, use of corrective linkage and use of circuit components, the non-linearity of which is opposite to that for which correction is desired. Also, linearizing circuits, which depend on segmenting the non-linear electrical representation of a physical measurement and approximating each segment by a linear response have been used. The circuit of the present invention falls into this latter category.

It is well known that a non-linear transducer, when combined in series with a correcting or linearizing circuit element which has a non-linearity exactly of the opposite type, will produce a combined response which is directly, or linearly, proportional to the physical variable. Thus, if the transducer has an output which is proportional to the square of the physical quantity, then a correcting circuit which has an output proportional to the square root of its input will, when combined, produce an output which is linearly proportional to the physical quantity. For every single valued non-linear function in a transducer, there is a linearizing function which is the reciprocal of the former and which when combined with the former produces the desired linear output presentation. The non-linear functions typical of many physical quanity transducers, such as those already mentioned, are subtle and complex. Rather than being represented by mathematical functions, they are often described in tabular form.

The degree of non-linear correction which is required in a given situation of indication, recording or controlling depends upon the use to which the result is to be subjected. Thus, if the result is used to establish the obligation of the buyer of a transferred commodity to the seller then a high degree of accuracy is required. On the other hand, if the information is only used to enlighten passersby as to the current ambient temperature then lesser accuracy or correction of non-linearity will suffice. Thus, correction is a matter of degree, with achievement being related to the extent of correcting techniques applied.

A standard technique for approximating ideal corrective functions is by means of connected variously inclined linear segments also known as a piece-wise linear approximation of a function. The matter is illustrated in FIG. 1 along with the errors which result when the piece-wise linear approximation is applied to the correction of a smooth function. While some error results, segments can always be chosen and distributed to keep the results within the desired error boundary.

SUMMARY OF THE INVENTION

In accordance with the present invention, there is provided a simple linearizer circuit capable of substantially replicating a non-linear waveform on a piece-wise basis. Briefly, the above is accomplished by providing a pair of circuits, one capable of reducing the slope of an output circuit curve when a predetermined output level has been reached and the other capable of increasing the slope of an output circuit curve when a different predetermined output level has been reached. Such circuits are cascaded in required order and with predetermined slope parameters to replicate a non-linear curve on a piece-wise basis.

The slope reducing circuit provides both a predetermined reference voltage and the input signal via a resistor to a comparator. When the comparator input signal voltage is equal to or greater than the reference signal voltage, an offset voltage free switch in the form of a relay, a field effect transistor (FET) or a complementary metal oxide silicon (CMOS) bilateral switch is closed by the comparator output and places a resistor of predetermined value and the reference voltage source in shunt with the input voltage signal. This, by voltage divider action, causes a reduction in slope of the output of the circuit for voltages equal to and greater than the reference voltage.

The slope increasing circuit provides both a predetermined reference voltage and the input signal to a comparator. When the input signal voltage is equal to or greater than the reference signal voltage, a switch in the form of a relay, FET or CMOS switch is closed by the comparator output and places the reference voltage through a resistor in shunt with the feedback voltage from the output of an operational amplifier. The circuit input provides the other operational amplifier input, the output being of increased slope when the input voltage is equal to or greater than the reference voltage.

The above described circuits can be cascaded in any desired manner and the individual circuit parameters can be adjusted in any desired manner to provide a desired slope segment of the curve and to provide a match for the totality of a non-linear curve.

By means of the present invention, slopes of greater and of lesser values than prior slopes may be formed in any sequence desired without having to pre-establish some closed control circuits which are then opened. The sensing of the voltage which causes the slope change, be it increasing or decreasing, is always taken near the input of the circuits and does not involve the amplifier, the gain of which is controlled. In the circuit disclosed, all elements function in the manner expected from their names, thus amplifiers only amplify, switches act as switches, comparators only compare. Because of this, the circuit is highly predictable and can be used to correct for or generate very subtle non-linearities such as produced by thermocouples. Gross changes may also be produced when desired.

In contrast, the prior art uses transistors and/or amplifiers as switches, floating reference sources, and in conjunction with diodes as one sided amplifiers. This practice makes the circuits less predictable and hence only useful for the correction or generation of gross non-linearities. The prior art favors circuits which either produce linear segments of increasing or decreasing slope and which, when they produce non-monotonic functions, sense the control voltage at the output of an amplifiers, rather than near the input.

BRIEF DESCRIPTION OF THE DRAWINGS

FIG. 2b is a graph of the output of the circuit of FIG. 2a;

FIG. 3b is a graph of the output of the circuit of FIG. 3a; and

DESCRIPTION OF THE PREFERRED EMBODIMENT

Figure 1:
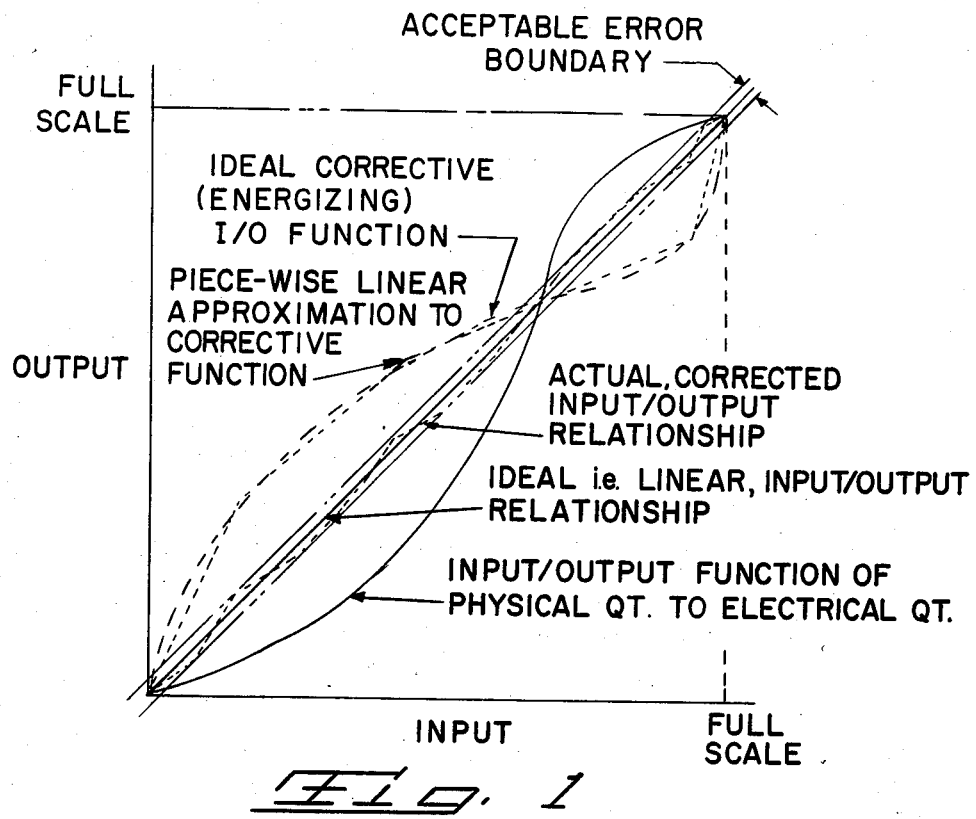
FIG. 1 is a graph showing the idealized and actual curves generated by the piece-wise linear approximation function in accordance with the present invention.
Figure 2A:
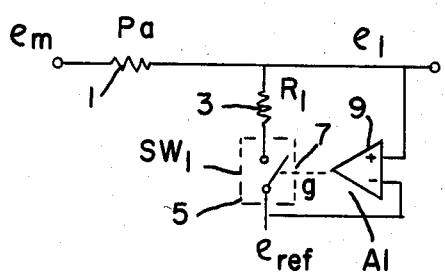
FIG. 2a is a schematic circuit diagram of a first form of linearizer circuit in accordance with the present invention.
Figure 2B:
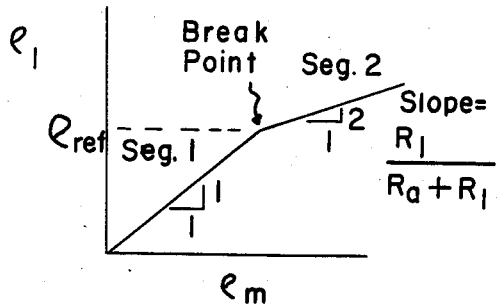
Figure 3B:
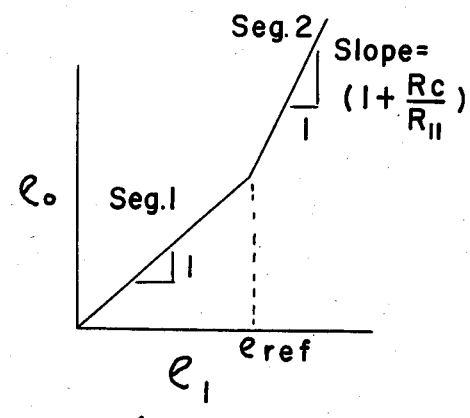

Referring now more specifically to FIGS. 2a and 2b, there are shown the elements of the first form of the linearizer (piece-wise linear curve generator) of this invention in its most simple one break transfer characteristic. The circuit comprises a series dropping resistor 1, a shunt resistor 3, a voltage operated shunt switch 5 such as may be implemented by means of a field effect transistor (FET) or a CMOS bilateral switch with the control electrode being the gate 7 and a high input impedance comparator amplifier 9 which controls the aforementioned switch. As long as the output voltage $e_1$ is less than the reference voltage $e_{ref}$, comparator amplifier 9 generates an output which maintains the switch 5 open. In this state $e_{in} = e_1$ (assuming no load impedance at the output terminal) and the slope of the transfer line is one. When the output becomes equal to the reference voltage $e_{ref}$, that condition is sensed by comparator 9 which closes switch 5. The closing of the switch 5 does not change the output at that instant since there is zero voltage across the switch before closing and hence no current through it immediately after closing. However, the slope of the transfer line has now been changed to a new value dictated by the original series resistor 1 and the newly switched in shunt resistor 3. The slope of the transfer line for values of $e_1$ greater than or equal to $e_{ref}$ is $R_1/(R_a+R_1)$ where $R_a$ is resistor 1 and $R_1$ is resistor 3, assuming the switch 5 and reference source $e_{ref}$ are of zero resistance. Even when the resistance is not zero, their known resistances can be lumped with resistor 3 to yield a very predictable multi-slope transfer circuit. The composite transfer characteristic of this piece-wise linear signal modifier or linearizer is the sum of the transfer functions of each segment. The effects of the segments other than the first are alterable by the adjustment of the singular shunt component. Each segment beyond the first is dependent on all prior segments for its starting point.

A novel and useful feature of the circuit of FIG. 2a is the stepless and stable shift from one slope to another and the resultant high predictability of the circuit performance. Further, additional shunt resistors, comparators and reference voltages may be added to come into play at many different voltage levels and thus produce a signal modifier with many break points and segments as described hereinbelow.

The circuit of this invention as so far described and as shown in FIG. 2a with performance depicted in FIG. 2b is limited to producing a series of segments where each higher voltage segment has less slope than its preceding lower voltage section. This limitation with its accompanying simplicity of design is useful in some circumstances. A second form of the invention produces segments of ever increasing slopes and will be described hereinbelow.

Figure 3A:
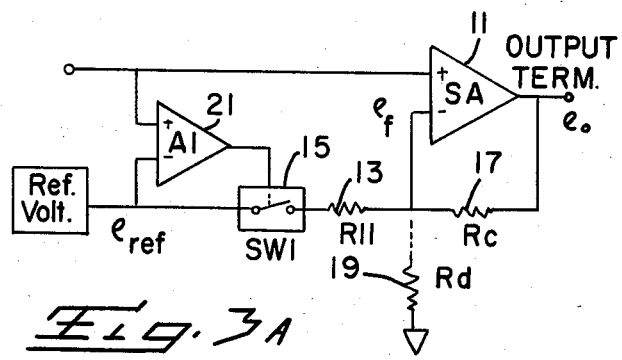
FIG. 3a is a schematic circuit diagram of a second form of linearizing circuit in accordance with the present invention.

FIG. 3a shows the circuit of the second form of the invention. Here the gain of the operational amplifier 11 is modified by the closing of the circuit path containing resistor 13, voltage controlled switch 15 and voltage reference $e_{ref}$. Input voltage $e_1$ and reference voltage $e_{ref}$ are fed to the inputs of comparator 21. When $e_1$ is equal to or greater than $e_{ref}$, the comparator 21 provides an output to close switch 15. Input voltage $e_1$ to this circuit is duplicated by the action of the operational amplifier 11, as feedback voltage, $e_f$ at its (−) input terminal in a well known manner. The resistor 17 attached to that terminal and between that terminal and the output terminal determines the output voltage $e_o$, which is required to establish the equality between $e_1$ and $e_f$, and thus establishes the gain of the circuit, or the slope of its input-output transfer characteristic. That slope modification does not take place until the input $e_1$ is equal to or greater than the reference voltage $e_{ref}$, making the slope (or gain) modification effective for voltages equal to or greater than the reference voltage. The gain modifying resistor 13 is switched into the circuit when there is zero voltage across the switch 15 before closing. There is no current through the switch immediately after closing thereof and the transfer from one slope to another is thus stepless and stable. The presence of optional resistor 19 is for the purpose of establishing an initial or first segment slope (or gain) of a value other than and greater than one. Its effect is additive to the slopes of all higher order segments.

The performance of this second form of the invention is predictable, novel and useful to those circumstances when increasing gain (slope) with input voltage is required. The further novelty of this invention is that the circuits of the first form and those of the second form may be combined as is shown in FIG. 4 to produce a third form producing slope (or gain) modifications of the increasing and decreasing type, sequentially and at will.

Figure 4:
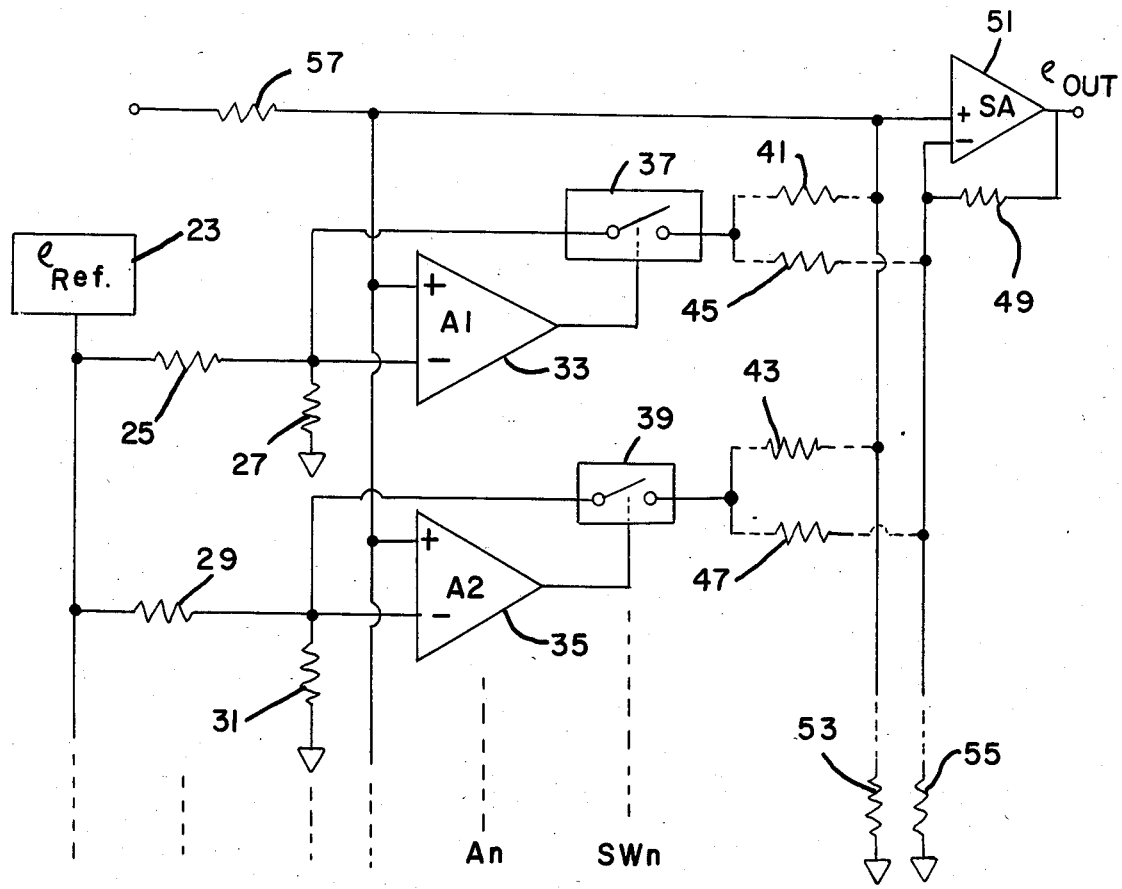
FIG. 4 is a circuit diagram cascading circuits of the type showing FIGS. 2a and 3a to provide an output curve of the type described with reference to FIG. 1.

The third form of this invention is shown in FIG. 4. Rather than using multiple reference sources, a single reference source 23 in conjunction with voltage dividers 25 and 27, 29 and 31, etc. are used to establish the break points at which comparators 33, 35, etc. become active and close voltage controlled switches 37, 39, etc. Switched shunt resistors 41, 43, etc., function as previously explained to reduce the transfer slope. Resistors 45, 47, etc. in cooperation with feedback resistor 49 and operational amplifier 51 function to increase the gain of the amplifier circuit when they become activated and thus increase the transfer slope of the whole circuit. For each circuit sub-section, only one of the two available slope determining resistors is normally chosen. The unselected resistor provision is left vacant. Resistors 53 and 55 in combination with resistors 57 and 49 are used to establish the transfer slope of the first segment, the one for which all switches are open.

The performance of the circuit is very predictable, so much so that digital computers may be used to select the components, given a transfer characteristic which is desired and an error criteria. Circuits having 4 and 5 sub-sections (break points) have been designed and routinely built to correct thermocouple and transducer non-linearities. More sections are possible but less frequently needed.

It can be seen with reference to FIG. 4 that, with appropriate selection of resistors, each of the elements will enter into the circuit at a different predetermined time to provide plural piece-wise linear curves which, in combination, duplicate a non-linear waveform.

Though the invention has been described with respect to a specific preferred embodiment thereof, many variations and modifications will immediately become apparent to those skilled in the art. It is therefore the intention that the appended claims be intepreted as broadly as possible in view of the prior art to include all such variations and modifications.

What is claimed is:

1. A linearizing circuit which comprises:
   (a) a plurality of slope altering circuits, and
   (b) output means coupled to said slope altering circuits,
   (c) each of said slope altering circuits including means responsive to a different predetermined input voltage for altering the slope of the output thereof to one of a greater or lesser value,
   (d) at least a predetermined one of said circuits providing a greater slope output than the input thereto and at least a predetermined one of said circuits providing a smaller slope output then the input thereto,
   (e) said circuit providing a smaller slope comprising:
   (f) a comparator having a pair of inputs for providing a signal output responsive to a predetermined difference in signals applied to said inputs,
   (g) circuit output means and reference voltage means connected to the inputs of said comparator, and
   (h) means responsive to said signal output from said comparator for placing a predetermined resistance between said circuit output and said reference voltage.

2. A linearizing circuit which comprises:
   (a) a plurality of slope altering circuits, and
   (b) output means coupled to said slope altering circuits,
   (c) each of said slope altering circuits including means responsive to a different predetermined input voltage for altering the slope of the output thereof to one of a greater or lesser value,
   (d) said slope altering circuits being cascaded,
   (e) at least a predetermined one of said circuits providing a greater slope output than the input thereto and at least a predetermined one of said circuits providing a smaller slope output than the input thereto,
   (f) said circuit providing a smaller slope comprising:
   (g) a comparator having a pair of inputs for providing a signals output responsive to a predetermined difference in signals applied to said inputs,
   (h) circuit output means and reference voltage means connected to the inputs of said comparator, and
   (i) means responsive to said signal output from said comparator for placing a predetermined resistance between said circuit output and said reference voltage.

3. A linearizing circuit which comprises:
   (a) a plurality of slope altering circuits, and
   (b) output means coupled to said slope altering circuits,
   (c) each of said slope altering circuits including means responsive to a different predetermined input voltage for altering the slope of the output thereof to one of a greater or lesser value,
   (d) at least a predetermined one of said circuits providing a greater slope output than the input thereto and at least a predetermined one of said circuits providing a smaller slope output then the input thereto,
   (e) said circuit providing a greater slope comprising:
   (f) an operational amplifier having a pair of inputs and an output,
   (g) feedback means coupled between said output and one of said inputs,
   (h) a source of reference voltage,
   (i) an input signal source,
   (j) a comparator having a pair of inputs and an output, said source of reference voltage and said input signal source being coupled to the inputs of said comparator whereby a signal is provided at the output of said comparator when a predetermined relation exists between said reference voltage and said input signal, and
   (k) switch means responsive to said signal on said output of said comparator for coupling said source reference voltage to said one of said inputs of said operational amplifier.

4. A linearizing circuit which comprises:
   (a) a plurality of slope altering circuits, and
   (b) output means coupled to said slope altering circuits,
   (c) each of said slope altering circuits including means responsive to a different predetermined input voltage for altering the slope of the output thereof to one of a greater or lesser value,
   (d) said slope altering circuits being cascaded, (e) at least a predetermined one of said circuits providing a greater slope output than the input thereto and at least a predetermined one of said circuits providing a smaller slope output than the input thereto, (f) said circuit providing a greater slope comprising:

(g) an operational amplifier having a pair of inputs and an output, (h) feedback means coupled between said output and one of said inputs, (i) a source of reference voltage, (j) an input signal source, (k) a comparator having a pair of inputs and an output, said source of reference voltage and said input signal source being coupled to the inputs of said comparator whereby a signal is provided at the output of said comparator when a predetermined relation exists between said reference voltage and said input signal, and (l) switch means responsive to said signal on said output of said comparator for coupling said source reference voltage to said one of said inputs of said operational amplifier.

5. A linearizing circuit as set forth in claim 1 wherein said circuit providing a greater slope comprises:

(a) an operational amplifier having a pair of inputs and an output, (b) feedback means coupled between said output and one of said inputs, (c) a source of reference voltage, (d) an input signal source, (e) a comparator having a pair of inputs and an output, said source of reference voltage and said input signal source being coupled to the inputs of said comparator whereby a signal is provided at the output of said comparator when a predetermined relation exists between said reference voltage and said input signal, and (f) switch means responsive to said signal on said output of said comparator for coupling said source reference voltage to said one of said inputs of said operational amplifier.

6. A linearizing circuit as set forth in claim 2 wherein said circuit providing a greater slope comprises:

(a) an operational amplifier having a pair of inputs and an output, (b) feedback means coupled between said output and one of said inputs, (c) a source of reference voltage, (d) an input signal source, (e) a comparator having a pair of inputs and an output, said source of reference voltage and said input signal source being coupled to the inputs of said comparator whereby a signal is provided at the output of said comparator when a predetermined relation exists between said reference voltage and said input signal, and (f) switch means responsive to said signal on said output of said comparator for coupling said source reference voltage to said one of said inputs of said operational amplifier.

7. A circuit for decreasing the slope of an output signal voltage therefrom relative to an input signal voltage thereto when said input signal voltage is above a predetermined value, comprising:

(a) a comparator having a pair of inputs for providing a signal output responsive to a predetermined difference in signals applied to said inputs, (b) circuit output means and reference voltage means connected to the inputs of said comparator, and (c) means responsive to said signal output from said comparator for placing a predetermined resistance between said circuit output and said reference voltage.

8. A circuit as set forth in claim 7 wherein said means responsive is an FET having source, drain and gate, the gate being coupled to the output of said comparator and the source and drain being coupled between said predetermined resistance and said reference voltage means.

9. A circuit as set forth in claim 7 further including a source of input signal and a predetermined resistance coupled between said source of input signals and said circuit output.

10. A circuit as set forth in claim 8 further including a source of input signal and a predetermined resistance coupled between said source of input signals and said circuit output.

11. A circuit for increasing the slope of an output signal voltage therefrom relative to an input signal voltage thereto when said input signal voltage is above a predetermined value, comprising:

(a) an operational amplifier having a pair of inputs and and output, (b) feedback means coupled between said output and one of said inputs, (c) a source of reference voltage, (d) an input signal source, (e) a comparator having a pair of inputs and an output, said source of reference voltage and said input signal source being coupled to the inputs of said comparator whereby a signal is provided at the output of said comparator when a predetermined relation exists between said reference voltage and said input signal, and (f) switch means responsive to said signal on said output of said comparator for coupling said source of reference voltage to said one of said inputs of said operational amplifier.

12. A circuit as set forth in claim 11 wherein said switch means is a CMOS switch having gate, source and drain, said gate being coupled to the output of said comparator and said source and drain being coupled between said source of reference voltage and said one of said inputs of said operational amplifier.

13. A circuit as set forth in claim 12 further including resistive means coupled between said CMOS switch and said one of said inputs to said operational amplifier.

14. A circuit as set forth in claim 11 further including resistive means coupled between ground and the junction of said feedback means and said resistive means.

15. A circuit as set forth in claim 12 further including resistive means coupled between ground and the junction of said feedback means and said resistive means.

16. A circuit as set forth in claim 13 further including resistive means coupled between ground and the junction of said feedback means and said resistive means.

* * * * *